Sept. 3, 1957 I. M. ROSS 2,805,397

SEMICONDUCTOR SIGNAL TRANSLATING DEVICES

Filed Oct. 31, 1952

INVENTOR
I. M. ROSS
BY
ATTORNEY

United States Patent Office 2,805,397

Patented Sept. 3, 1957

2,805,397

SEMICONDUCTOR SIGNAL TRANSLATING DEVICES

Ian M. Ross, Summit, N. J., assignor to Bell Telephone Laboratories, Incorporated, New York, N. Y., a corporation of New York Application October 31, 1952, Serial No. 318,054

2 Claims. (Cl. 332—52)

This invention relates to semiconductor signal translating devices and more particularly to such devices of the type disclosed in the applications Serial No. 243,541, filed August 24, 1951, of W. Shockley, now Patent 2,744,970, issued May 8, 1956, and Serial No. 318,053, filed October 31, 1952, of G. C. Dacey and I. M. Ross, now Patent No. 2,778,956 issued January 22, 1957.

Devices of the type disclosed in the applications above-identified comprise, in general, a body of semiconductive material, for example germanium or silicon, having a pair of substantially ohmic connections, herein termed the source and drain, to spaced areas thereof. The bulk of the body is of one conductivity type, that is N or P, and the source and drain are relatively biased to establish a flow of majority carriers from the source to the drain. When the bulk is of N conductivity type, the majority carriers are electrons; when it is of P type, the majority carriers are holes.

The body has therein a region or zone of the conductivity type opposite that of the bulk and adjacent or encompassing the path of flow of the majority carriers from the source to the drain. An ohmic connection, herein termed the gate, is made to this zone or region and is energized so that the PN junction between the bulk of the body and the gate zone is biased in the reverse direction. Because of this reverse bias, a space charge region obtains adjacent the junction, the extent of this region being dependent upon and variable with the gate potential. Variations in the extent of this region result in variations in the cross sectional area of the path for flow of majority carriers through the bulk, between the source and drain. Thus, the gate may be utilized to control the current to the drain, effecting a modulation in the resistance of the source to drain current path. This transistor is of the "field effect" type in which the conductivity of a layer of semiconductive material is modulated by a transverse electric field. The theory for the new form of transistor has been presented in an article by W. Shockley, "A Unipolar 'Field-Effect' Transistor" appearing in the November 1952 Proceedings of the I. R. E., pages 1365 through 1376. Since the amplifying action involves currents carried predominantly by one kind of carrier, the name "unipolar" has been proposed to distinguish these transistors from point-contact and junction types which are "bipolar" in this sense. The article defines the new unipolar transistor terminology which has now received wide acceptance by workers in the field.

Such devices may be employed as amplifiers, signals being impressed between the source and gate and amplified replicas of these signals being derived in a load connected between the gate and drain. Also, the devices may be operated as oscillation generators, for example as disclosed in the Dacey and Ross application referred to hereinabove.

In devices of the type described, flow of majority carriers to the drain is accompanied by generation of minority carriers in the region adjacent the drain. Because of the reverse bias on the junction aforementioned and the effect of the majority carriers, a field may be established in the gate-drain region such as to cause flow of minority carriers from the drain region to the gate. Such flow, if uncontrolled, leads to instability, for example in cases where the devices are operated as amplifiers.

One general object of this invention is to enable control of the flow of minority carriers from the drain to gate in semiconductive signal translating devices of the type above described.

More specific objects of this invention are to suppress such minority carrier flow and to control such flow in a manner to modulate the output or load current.

In accordance with one feature of this invention, an auxiliary connection is provided to the semi-conductive body in the region between the gate and drain and operated to attract minority carriers thereto.

In one illustrative embodiment, an auxiliary zone of conductivity type opposite that of the bulk of the body is provided in the body between the gate and drain regions and biased to attract minority carriers. For example, if the bulk of the body is of N type, so that the majority carriers are electrons and the minority carriers are holes, the auxiliary zone is made of P type and is biased strongly negative with respect to the drain. Thus, it attracts holes and substantially prevents hole flow from the drain to the gate.

In another specific embodiment of this invention, the source, gate and drain are associated to constitute, with the semiconductive body, an oscillation generator and the potential of the auxiliary zone is controlled to vary the minority carrier flow to the gate thereby to amplitude modulate the oscillator frequency.

The invention and the above-noted and other features thereof will be understood more clearly and fully from the following detailed description with reference to the accompanying drawing in which.

Figure 1:
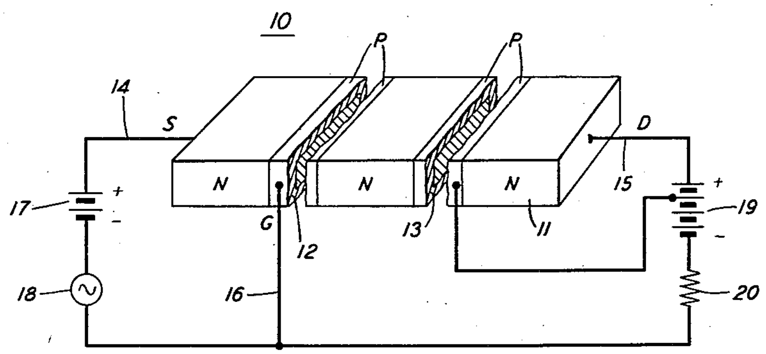
Fig. 1 is in part a perspective view of a semiconductive element and in part a circuit diagram illustrating one embodiment of this invention.

Referring now to the drawing, the signal translating device depicted in Fig. 1 comprises a body 10 of semiconductive material such as germanium or silicon, the bulk 11 of the body being of one conductivity type, for example N as indicated in the figure. The body has therein two spaced zones 12 and 13, for example in the form of bands encompassing the bulk of the body. These zones are of the conductivity type apposite that the bulk 11, specifically P type when the bulk is N type as shown.

The zones 12 and 13 may be produced in the body 10 by alloying an appropriate impurity with the bulk or diffusing such an impurity into the bulk. For example, if the bulk 11 is of N conductivity type, the zones 12 and 13 may be produced by applying coatings of an acceptor material such as indium about two spaced regions of the body and heating the assembly to alloy the acceptor with the N type material thereby to form the zones 12 and 13. If the bulk 11 is of P conductivity type, the zones 12 and 13 may be formed by applying coatings of a donor impurity such as antimony and heating the assembly to alloy the donor with the bulk material thereby to produce the zones 12 and 13.

Substantially ohmic source and drain connections 14 and 15 are made to opposite ends of the semiconductive body and an ohmic gate connection 16 is made to the zone 12. Both the source and drain are biased in the reverse direction relative to the gate. For example, the source may be biased by a battery 17 in series with a signal source represented by the generator 18 and the drain 15 may be biased by a battery 19 in series with a load represented by the resistor 20. The drain bias is substantially larger than that on the source. The auxiliary zone 13 is biased strongly with respect to the drain at the polarity to attract minority carriers from the drain region thereto.

Figure 2:
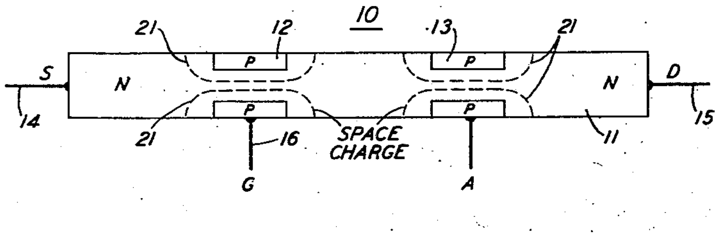
Fig. 2 is a sectional view of the semiconductive body depicted in Fig. 1.

By virtue of the reverse biases upon the zones 12 and 13 space charge regions, the boundaries of which are indicated at 21 in Fig. 2, obtain adjacent these zones. The extent or thickness of the space charge regions is dependent upon the reverse biases upon the junctions between the bulk 11 on the one hand and the zones 12 and 13 on the other. Thus, as the potential of the gate 16 is varied in accordance with signals from the generator 18, the thickness of the space charge region adjacent the gate varies in like manner whereby in effect the conductivity of the path for carriers from the source 14 to the drain 15 is modulated in accordance with the signals. Hence, amplified replicas of the signals appear at the load 20. For the case depicted in the drawing, that is where the bulk 11 is of N conductivity type, the majority carriers flowing from source to drain are electrons.

As has been noted hereinabove, flow of such majority carriers is accompanied by the appearance of minority carriers, holes in the particular embodiment portrayed, at the drain region. These minority carriers tend to flow toward the gate zone 12 and if received thereby alter the operating characteristics of the device.

In accordance with a feature of this invention, the flow of minority carriers from the drain is controlled. Specifically, in the embodiment depicted in Fig. 1, by virtue of the bias upon the zone 13 minority carriers from the drain region are attracted to the zone 13 whereby minority carrier flow to the gate is substantially suppressed and stable operating characteristics are obtained.

In a typical device illustrative of this invention, the semiconductive body 10 may be of germanium with the source biased at 3 volts relative to the gate and the drain 15 biased at 30 volts also relative to the gate. The auxiliary zone may be biased at 3 volts relative to the drain and at such potential as to attract minority carriers thereto.

Figure 3:
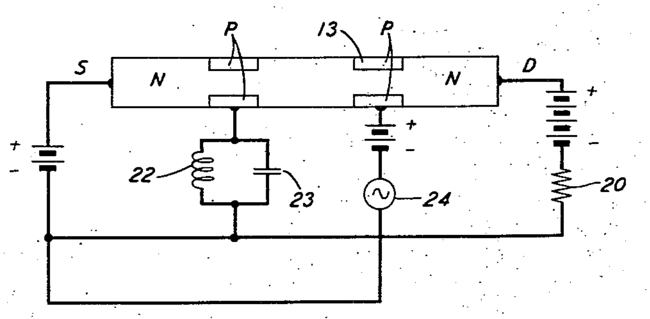
Fig. 3 is a circuit schematic portraying an amplitude modulated oscillation generator illustrative of another embodiment of this invention.

The invention may be embodied also in devices such as illustrated in Fig. 3 operable as oscillation generators. As shown in this figure, a parallel resonant circuit comprising the inductance 22 and capacitor 23 is provided common to the source and drain circuits. As disclosed more fully in the application of Dacey and Ross referred to hereinabove, minority carriers flow from the drain to the gate whereby the gate exhibits a negative resistance and oscillations are generated. The magnitude of the minority carrier flow from the drain to the gate is varied, as by a signal source 24 applied to the auxiliary zone 13. Thus, the oscillations generated and appearing at the load 20 are amplitude modulated in accordance with signals from the generator 24.

Although in the specific embodiments shown in the drawing and described hereinabove the bulk of the semiconductive material 11 is of N conductivity type and the zones 12 and 13 are of P type, the reverse may also be employed, that is the bulk may be of P type and the zones 12 and 13 of N type. For such case the majority carriers are holes and the minority carriers are electrons. The polarity of the potentials involved should then be the reverse of those indicated in the drawing. It will be understood further that the specific embodiments of the invention shown and described are but illustrative and that various modifications may be made therein without departing from the scope and spirit of this invention.

Reference is made of the application Serial No. 317,884, filed October 31, 1952, of W. Shockley, now Patent 2,778,885 issued January 22, 1957, wherein a related invention is disclosed.

What is claimed is:

1. A signal translating device comprising a body of semiconductive material having a region of one conductivity type, source and drain connections to spaced points of said region, gate means including a portion of said body defining a rectifying junction with said region between said points, a first circuit between said source and said gate means, a second circuit connected between said drain and said gate means, said first and second circuits having a common resonant portion, means biasing both said source and said drain in the reverse direction relative to said gate means, the bias on said drain being substantially greater than that of said source, and means for modulating carrier flow from said drain to said gate means comprising an auxiliary connection to said region between said drain and gate means.

2. A signal translating device comprising a body of semiconductive material having a region of one conductivity type, source and drain connections to spaced points of said region, said body having therein a gate zone and an auxiliary zone, both of the opposite conductivity type and contiguous with said region, said gate zone being between said points and said auxiliary zone being between said gate zone and said drain, means biasing said source and drain in the reverse direction relative to said gate zone, the bias on said drain being substantially greater than that on said source, a first circuit connected between said source and said gate zone, a second circuit connected between said drain and said gate zone, said circuits having a common resonant portion, means biasing said auxiliary zone in the reverse direction relative to said region, and means for varying the potential of said auxiliary zone.

References Cited in the file of this patent

UNITED STATES PATENTS

| | | |
|---|---|---|
| 2,570,978 | Pfann | Oct. 9, 1951 |
| 2,600,500 | Haynes et al. | June 17, 1952 |
| 2,623,102 | Shockley | Dec. 23, 1952 |
| 2,623,105 | Shockley et al. | Dec. 23, 1952 |
| 2,672,528 | Shockley | Mar. 16, 1954 |
| 2,701,302 | Giacoletto | Feb. 1, 1955 |

OTHER REFERENCES

"Unipolar Field Effect Transistor," Dacey and Ross; Pro. IRE, vol. 41, No. 8, Aug. 1953.